United States Patent [19]

Montgomery

[11] Patent Number: 4,514,355
[45] Date of Patent: Apr. 30, 1985

[54] PROCESS FOR IMPROVING THE HIGH TEMPERATURE FLEXURAL STRENGTH OF TITANIUM DIBORIDE-BORON NITRIDE

[75] Inventor: Lionel C. Montgomery, Bay Village, Ohio

[73] Assignee: Union Carbide Corporation, Danbury, Conn.

[21] Appl. No.: 452,183

[22] Filed: Dec. 22, 1982

[51] Int. Cl.³ .............................................. C04B 35/60
[52] U.S. Cl. ...................................... 264/332; 501/96; 264/346
[58] Field of Search ..................... 264/65, 60, 85, 332, 264/346; 501/96

[56] References Cited

U.S. PATENT DOCUMENTS

| | | | |
|---|---|---|---|
| 3,003,885 | 10/1961 | Mandorf, Jr. .......................... | 501/96 |
| 3,215,545 | 11/1965 | Reidl et al. ............................ | 501/96 |
| 3,544,486 | 12/1970 | Passmore .............................. | 501/96 |
| 3,591,668 | 7/1971 | Kirchner et al. . | |
| 3,649,312 | 3/1972 | Stibbs ................................... | 264/332 |
| 3,673,118 | 6/1972 | Mandorf, Jr. et al. . | |
| 3,928,244 | 12/1975 | Passmore .............................. | 501/96 |
| 4,007,251 | 2/1977 | Isaksson et al. ....................... | 501/96 |
| 4,089,931 | 5/1978 | Sharma et al. ........................ | 264/82 |
| 4,097,567 | 6/1978 | Cebulak et al. ....................... | 264/65 |
| 4,376,742 | 3/1983 | Mah ..................................... | 264/85 |

FOREIGN PATENT DOCUMENTS

1010492  11/1965  United Kingdom ................. 264/65

OTHER PUBLICATIONS

"Hot Pressing Boron Nitride for Space Fuel Systems", V. C. Wahler.

Primary Examiner—Winston A. Douglas
Assistant Examiner—Terryence Chapman
Attorney, Agent, or Firm—John C. LeFever

[57] ABSTRACT

A process for improving the high temperature flexural strength of titanium diboride-boron nitride ($TiB_2$-BN) intermetallic compositions which comprises reheating hot pressed $TiB_2$-BN stock to about 2000° C. for about four hours in an inert atmosphere.

8 Claims, No Drawings

PROCESS FOR IMPROVING THE HIGH TEMPERATURE FLEXURAL STRENGTH OF TITANIUM DIBORIDE-BORON NITRIDE

FIELD OF THE INVENTION

Shaped intermetallic compositions comprising titanium diboride and boron nitride are employed in the aluminum vapor coating industry and are commonly referred to as aluminum vaporization "boats". These boats perform two functions in an aluminum vapor deposition process, specifically: (1) as a receptacle to contain the molten aluminum as it is being continuously vaporized; and (2) to carry the electrical current which is the heating means to raise the aluminum to its vaporization temperature by resistance heating.

The subject invention is a process for improving the high temperature flexural strength of aluminum vaporization boats comprising titanium diboride and boron nitride. Such boats possessing improved high temperature flexural strength are particularly sought after in those applications where the boats employ pressure-loaded end clamps as the connecting means to the source of electrical power.

STATEMENT OF THE PRIOR ART

Conventionally, titanium diboride-boron nitride billets are produced by hot pressing a blend of titanium diboride and boron nitride powders in the desired ratio under suitable high temperatures and pressures. Receptacles, or as is commonly referred to, as stated above, vaporization boats, are machined from these billets to the end user's specifications and then employed by the end user for the vaporization of aluminum. Unfortunately, when these conventionally produced vaporization boats are installed in a vacuum metalizer wherein the electrical current for resistance heating is imparted to the boat by pressure-loaded end clamps, they tend to bow due to the compression stresses that occur as their temperature approaches the aluminum vaporization temperature and they exhibit a relatively short life.

The principle object of this invention is to provide a process for imparting improved high temperature flexural strength to aluminum vaporization boats comprising titanium diboride and boron nitride.

SUMMARY OF THE INVENTION

The invention resides in the discovery that a thermal leaching step, as will be fully described hereafter, which may be readily incorporated in an otherwise conventional manufacturing process, will improve the high temperature strength of aluminum vaporization boats comprising titanium diboride and boron nitride. These thermally leached boats are resistant to bowing under end-clamp pressure at aluminum vaporization temperatures and exhibit normal life characteristics when compared to the boats that employ electrical connecting means other than pressure-loaded end clamps such as the commonly employed graphite slot clamps.

DETAILED DESCRIPTION OF THE INVENTION

In an otherwise conventional process for producing titanium diboride-boron nitride billets which are produced by hot pressing a blend comprising titanium diboride and boron nitride powders in a range from 20% to 80% $TiB_2$ and 80% to 20% BN plus, optionally, a small amount of an additive compatible binder such as calcium oxide (CaO), perferably in the range of 0.1 to 5% by weight of the $TiB_2$-BN blended mix, under temperatures in the range of from 1600° C. to 2200° C. and pressures of 1000 to 3000 psi in an inert atmosphere, a thermal leaching step is introduced. In this so-called thermal leaching step a binder material formed from oxygen present in the BN, which binder is necessary in the hot pressing step of forming the billet, is removed therefrom by evaporation at elevated temperatures, preferably between about 1600° C. and 2200° C.

EXAMPLE I

Step 1. A blend comprising 1500 grams of $TiB_2$ and 1500 grams of BN powder that contains approximately 3% oxygen in the BN lattice was uniformly mixed. To this blend is added 31 grams of CaO as added binder.

Step 2. The uniform blend was loaded into a graphite mold and subjected to a temperature of approximately 2000° C. and a pressure of 2500 psi for 60 minutes.

Step 3. The hot pressed $TiB_2$-BN billet was unloaded from the mold and machined into vaporization boat size strips.

Step 4. The strips were loaded into a sinter furnace where they were surrounded by a pack of BN powder to help prevent oxidation of the strips and to provide support during the thermal leaching.

Step 5. The so supported strips of Step 4 were heated in an atmosphere of argon to a temperature of approximately 2000° C., said 2000° C. temperature being reached by a heating rate of about 400° C. per hour from room temperature to 1600° C. and a rate of 100° C. thereafter to 2000° C., held for four hours, and then allowed to cool at its natural rate; and Step 6. The cooled $TiB_2$-BN strips were machined into boats suitable for use in aluminum vaporization.

In Table I below, a comparison of critical properties of an identical composition vaporization boat for use in aluminum vaporization comprising $TiB_2$ and BN and a small amount of additional binder material without thermal leaching and boats with thermal leaching as prepared by Example I are shown.

TABLE I

| Material | Density g/cc | Flexural Strength psi 25° C. | Flexural Strength psi 1500° C. | Modulus of Elasticity psi × $10^6$ | Electrical Resistivity Micro-ohm-M 25° C. |
|---|---|---|---|---|---|
| Vaporization boat ($TiB_2$—BN + CaO) | 2.96 | 14,000 | 2,150 | 16.0 | 5.96 |
| Vaporization boat ($TiB_2$—BN + CaO) leached at 2000° C. for 4 hours | 2.83 | 10,800 | 4,900 | 12.8 | 4.23 |

Thus it will be appreciated that while the thermal leaching operation resulted in about a twenty-three percent reduction in flexural strength at 25° C., which is of no consequence in industrial application, it also resulted in an increase of about one hundred twenty-eight percent in the flexural strength at 1500° C. Due to a weight loss of about six percent, the density decreases approximately 4.5 percent. In addition, because of the creation of ceramic bonds at the elevated temperature ($TiB_2$ to BN), the electrical resistivity was reduced about twenty-nine percent. Any negative consequences of these other reductions are more than offset for the vaporization boat as a whole by the increase in the high temperature flexural strength. In the practice of the invention, the heating rate (and cooling rate) in the thermal leaching step is not particularly critical. Practically speaking, there is no minimum heating rate, and it is a function of efficient operation. The maximum heating rate depends upon the thickness of the vaporization boat strip that is to be heated as well as the quantity and type of low-melting binder phase to be removed and may readily be determined by experimentation. For example, strips one-half inch thick can be safely heated to 2000° C. at a heating rate of 400° C./hour to 1600° C. and thereafter at 100° C./hour to 2000° C. without structural damage occurring to the strip. On the other hand, strips one-inch thick should not be heated in excess of 50° C./hour between 1600° C. and 2000° C. since a cracking of the strips would probably result. Slower heating rates through the critical range of 1600° C. to 2000° C. is needed if $B_2O_3$ is the only low melting binder phase present.

The maximum temperature to be employed in the thermal leaching step may be varied approximately between 1800° C. and 2200° C. as long as sufficient hold time is provided to vaporize the bond phase (such as boric oxide or calcium oxyborate) in the hot pressed strip. Again, a suitable hold time may be readily determined by experimentation. By way of further example, the hot pressed $TiB_2$-BN strip of Example I, if heated to only 1800° C., rather than 2000° C. would require a hold time of ten hours rather than the four hours as was the case with Example I.

In addition to cutting the original hot pressed $TiB_2$-BN billets into strips, the original uncut billet may be subjected to the thermal leaching process immediately after hot pressing, thereby conserving energy. However, it should be recognized that the length of the diffusion path through the large billet makes the process very slow in this case and that the slight expansion of the billet which occurs during thermal leaching may be troublesome in large pieces.

Further, the high temperature flexural strengthening of $TiB_2$-BN boats at the vaporizing temperature may also take place by slowly heating them when installed in the vacuum metallizer and before aluminum is vaporized in them. For example, the boats may be heated to 2000° C. (¼-inch thick boats) with a heating time of approximately forty-five minutes between 1500° C. and 2000° C. A hold time of about forty-five minutes is believed to be sufficient to vaporize some of the bond phase ($B_2O_3$ or calcium-oxyborate) and to create $TiB_2$-BN high flexural strength aluminum vaporization boats.

Inert atmospheres other than argon as employed in Example I, such as high vacuum or helium are also acceptable in the practice of the process of the invention.

Finally, the invention is also useful with aluminum vaporization billets, strips or boats containing in addition to $TiB_2$ and BN such additives as AlN, TiN, Al, Ni, and Ti in the range of 0 to 50 weight percent of the total weight of the article being treated.

I claim:

1. A process for producing an intermetallic composition comprising titanium diboride and boron nitride having enhanced high temperature flexural strength characteristics, said process comprising forming a uniform blend of titanium diboride and boron nitride powders containing oxygen in a bond phase, hot pressing said uniform blend in an inert atmosphere at elevated temperatures to form a solid body, discontinuing the hot pressing of the body and subsequently heating the solid body between approximately 1600° C. and 2200° C. in an inert atmosphere for from about four hours to about 10 hours to vaporize said bond phase of said hot pressed body.

2. The process of claim 1 wherein the second heating step is performed in an argon atmosphere.

3. The process of claim 1 wherein an additive of CaO is introduced to the blend before hot pressing.

4. The process of claim 3 wherein the amount of CaO additive is from about 0.1 to about 5% by weight of the $TiB_2$-BN blend.

5. The process of claims 1, 2, 3, or 4 wherein the second heating step is at a temperature of approximately 2000° C. for about four hours.

6. The process of claims 1, 2, 3, or 4 wherein the ratio of titanium diboride to boron nitride in said blend is from 20 to 80% by weight titanium diboride and 80 to 20% by weight boron nitride.

7. The process of claim 6 wherein the hot pressing is performed at a temperature in the range of 1600 to 2100 and a pressure in the range of from 1000 to 3000 psig.

8. The process of claim 6 wherein in addition to titanium diboride and boron nitride, the intermetallic compositions include one or more of the materials selected from the group consisting of AlN, TiN, Ti, Al, Ni, in the range of 0 to 50 weight percent of the intermetallic composition.

* * * * *